United States Patent [19]

Ventura

[11] Patent Number: 4,720,916
[45] Date of Patent: Jan. 26, 1988

[54] PROCESS FOR PRODUCING PROTECTIVE ENVELOPES IN WHICH CORRESPONDING ELECTRIC-ELECTRONIC CIRCUIT COMPONENTS ARE DIPPED

[75] Inventor: Giorgio Ventura, Castelmaggiore, Italy

[73] Assignee: Arcotronics Italia S.p.A., Sasso Marconi, Italy

[21] Appl. No.: 915,877

[22] Filed: Oct. 8, 1986

Related U.S. Application Data

[63] Continuation of Ser. No. 749,745, Jun. 28, 1985, abandoned.

[30] Foreign Application Priority Data

Jul. 27, 1984 [IT] Italy ................................ 3538 A/84

[51] Int. Cl.⁴ .......................................... H05K 13/00
[52] U.S. Cl. ...................................... 29/856; 29/412; 29/527.1; 29/828; 29/DIG. 48
[58] Field of Search .................. 29/400 C, 841, 855, 29/856, 613, 858, 884, 412, 422, 527.1, 530, DIG. 48; 174/52 PE

[56] References Cited

U.S. PATENT DOCUMENTS

| | | | |
|---|---|---|---|
| 3,076,051 | 1/1963 | Haba | 29/856 X |
| 3,364,567 | 1/1968 | Brown et al. | 29/856 |
| 3,501,833 | 3/1970 | Spiegler | 29/841 X |
| 3,838,316 | 9/1974 | Brown et al. | 29/841 X |
| 4,045,867 | 9/1977 | Ström | 29/856 |
| 4,079,511 | 3/1978 | Grabbe | 29/841 X |
| 4,268,942 | 5/1981 | Meal et al. | 29/856 X |
| 4,330,790 | 5/1982 | Burns | 29/856 X |
| 4,451,973 | 6/1984 | Tateno et al. | 174/52 PE X |

FOREIGN PATENT DOCUMENTS 629494 12/1961 Italy ...................................... 29/841

Primary Examiner—Howard N. Goldberg
Assistant Examiner—Joseph M. Gorski
Attorney, Agent, or Firm—Carl A. Forest

[57] ABSTRACT

The process comprises creating two conductor strips provided with end pieces whose external parts are bent on one and the same side, welding the electric-electronic components to the bent parts of corresponding end pieces, making a mold, inserting into the mold the unit constituted by the strips and the components, pouring liquid sealant into the mold in such a way as to cover the components but not the strips, with this condition being maintained until the sealant has set, separating the mold from the one piece block of sealant in which the components are dipped and from which project, at least partially, end pieces, removing the strips from the corresponding end pieces in order to define with these, the electrical terminations of the components, bending the terminations against the longitudinal sides of the one piece block and cutting the block along crosswise planes that do not effect the components.

29 Claims, 10 Drawing Figures

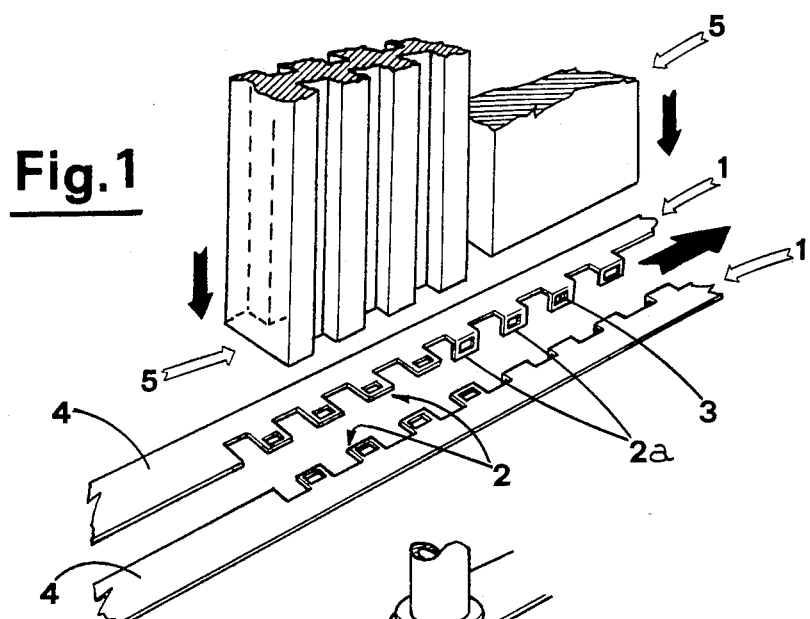
Fig. 1
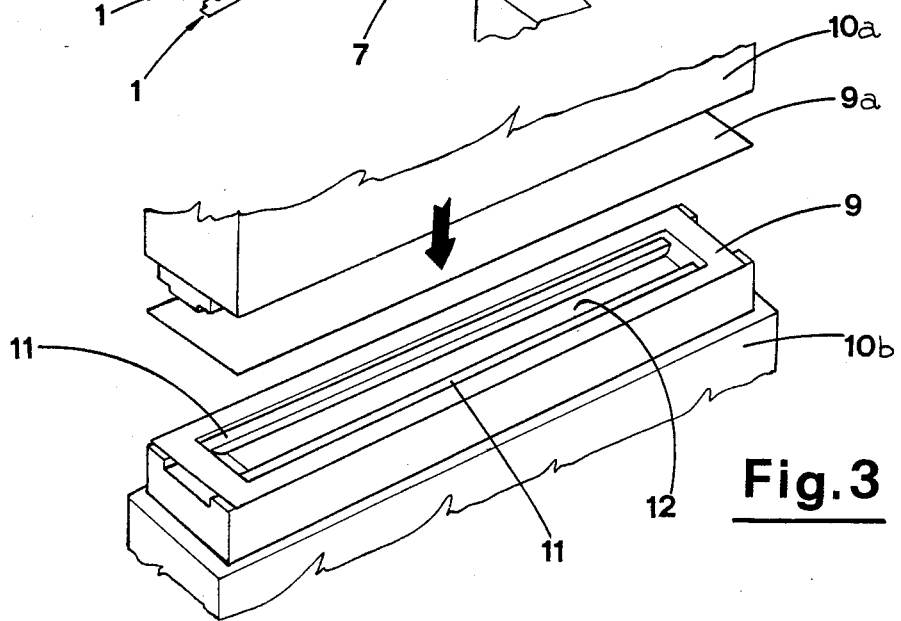
Fig. 2
Fig. 3

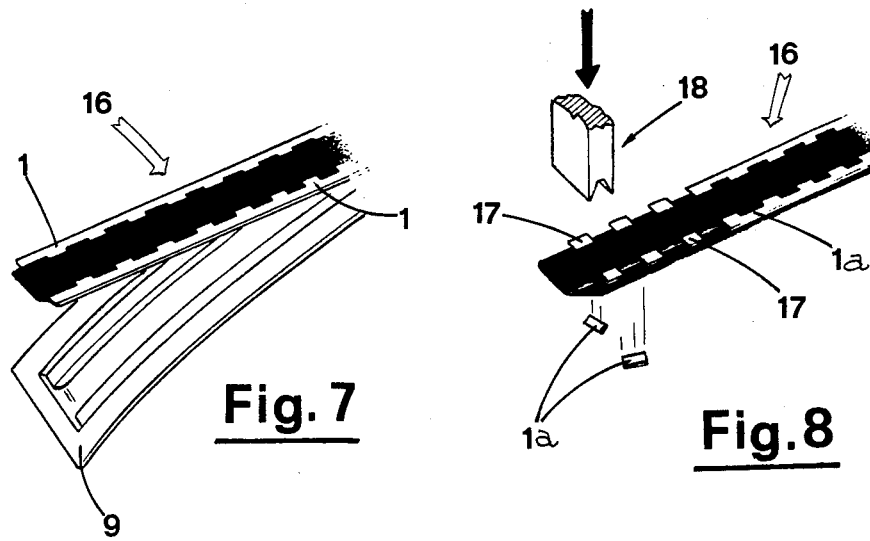
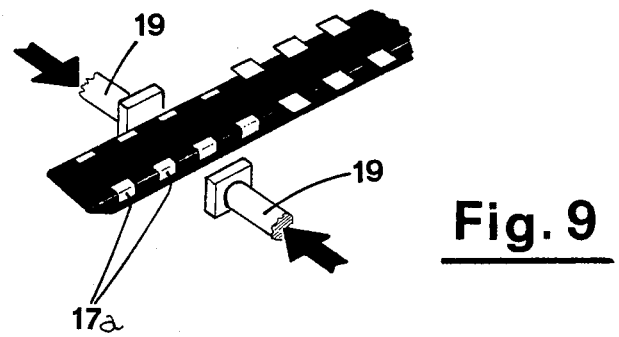
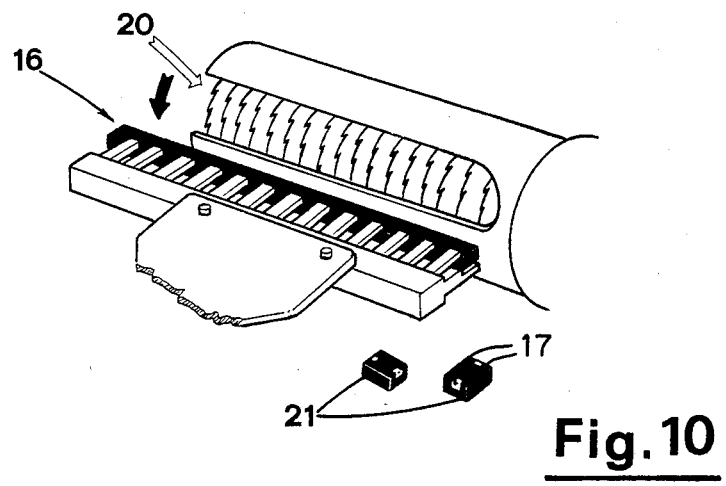

PROCESS FOR PRODUCING PROTECTIVE ENVELOPES IN WHICH CORRESPONDING ELECTRIC-ELECTRONIC CIRCUIT COMPONENTS ARE DIPPED

This application is a continuation of application Ser. No. 749,745, filed June 28, 1985, now abandoned.

BACKGROUND OF THE INVENTION

The invention relates to a process for producing protective envelopes in which corresponding electric-electronic circuit components are dipped.

DESCRIPTION OF THE PRIOR ART

A process called "surface mounting" is known with which circuit components are subjected to the direct action of heat at the time the electrical terminations thereof are being welded to printed circuit conductor tracks. When in this condition, either the component itself withstands the welding temperature (on an average around 260° C.), as in the case of ceramic components, or the component has to be given a suitable protective envelope (capsule) of insulating material (for example synthetic resin), otherwise the said component would be destroyed. With the said process it is envisaged that the component be positioned up against one side of the printed circuit board so that the individual electrical terminations mate with corresponding conductor tracks, that the said positioning be rendered stable (for example by bonding the component to the said side), and then that the terminations be welded to the tracks. During the said operation that is performed with the use of known techniques (such as a solder bath or the insertion of the unit consituted by the board and the components, into an oven) that do not fall within the scope of the invention, the heat hits directly the side of the board on which the components are placed; if the components were not protected in an envelope able to resist the welding temperature, the heat would ruin them. The process according to the invention belongs to the particular technical field concerned with the production of protective envelopes for circuit components destined, out preference, to be mounted in the way to which reference has just been made.

Known already is the production of protective envelopes with the use of prior adopted integrated circuit techniques.

With this process, it is necessary to make a mould provided with a plurality of impressions so dimensioned as to correspond to the outside dimensions required for the parallelepiped envelope in which the components are contained, and a metal frame provided internally with end pieces in facing pairs, the dimensions of which have to meet very narrow tolerances since the extreme edge of the frame has to fit perfectly into the corresponding seat in the mould and the end pieces concerned have to be positioned in the region of the corresponding impression. It is also necessary to bond the components to the said end pieces, to place in the mould the unit constituted by the frame and the components, and then to inject thermosetting resin into the said mould.

This modus operandi brings about quite a number of problems, the main ones of which are listed hereunder;

the mould is of a high cost and, amongst other things, allows only envelopes of predetermined sizes to be produced;

the mould construction procedure is lengthy;

the equipment for making the frames is costly because of the very narrow tolerances in dimensions required for these;

the need to use only resins that can be pressure injected into the mould;

the necessity for frequent cleaning of the inpression areas in the mould;

the need to deburr the mating surfaces of the shells that go to make up the mould, because of the penetration thereon of insulating material due to non proper sealing of the said surfaces, as well as the need to remove any insulating material that may have deposited itself on the parts of the end pieces that project out of the envelope, since once the edge of the frame has been separated from the said end pieces, the electrical terminations of the corresponding components will be constituted by the said parts.

To recapitulate, costs are high with the foregoing method of producing protective envelopes, and since with any one mould only one type of envelope can be formed, there is a complete lack of flexibility. Furthermore, whilst the material used to produce the protective envelopes is suited to components that dissipate heat (discharged externally), it is no way suited to other components (such as capacitors) for which efficient protection against the heat developed at the time of welding is required.

SUMMARY OF THE INVENTION

The process proposed herein concerns the production of protective envelopes for electric-electronic components destined, for example, to be "surface mounted" on corresponding printed circuits in a sequence of elementary phases that do not necessitate the use either of injection moulds or of complicated items of equipment, and with which the use is possible of the material most suited to the particular application to which the protectively enveloped components in question are to be put and, furthermore, that render the process extremely flexible as regards variations in the dimensions of the protective envelopes in accordance with the requirements. The foregoing being achievable with a notable reduction in costs compared to the envelopes produced up until now. The process according to the invention for producing protective envelopes in which corresponding electric-electronic circuit components are dipped comprising the following phases: (a) the formation of a plurality of flat or filiform conductor elements; (b) the connection, by means of welding, of the free ends of each of the said circuit components to corresponding conductor elements; (c) the creation of a mould in which there is at least one longitudinal impression, suitable to receive a circuit components unit pre-equipped with corresponding conductor elements, placed orderly side-by-side and spaced one from the other; (d) the stable insertion into the mould of the said unit with the circuit components positioned in the said impression; (e) the pouring of a liquid sealant into the said impression so as to cover only the unit components, then left to set; (f) the separation, one from the other, of the said mould and the one piece block thus formed of hardened sealant in which the said circuit components are dipped, from which the said conductor elements at least partially project: (g) the formation, from the said one piece block, of a plurality of small blocks made of solidifiel sealant, inside each of which is contained one corresponding circuit component from which the electrical terminations protrude.

BRIEF DESCRIPTION OF THE DRAWINGS

Emphasis is given below to characteristics of the invention that do not emerge from what has been stated above, with reference to the accompanying drawings in which the phases that contribute to the definition of one preferred embodiment for the process in question are shown diagrammatically:

FIG. 1 shows the creation of the conductor strips;

FIG. 2 shows the welding of the components to the strips;

FIG. 3 shows the creation of a tank shaped mould;

FIG. 7 shows the separation of the mould from the solidified sealant in which the components are contained;

FIG. 8 shows the cutting of the longitudinal edges of the strips in order to define therewith the electrical terminations of the components;

FIG. 9 shows the bending of the electrical terminations against the longitudinal sides of the said one piece block;

FIG. 10 shows the crosswise cutting of the said one piece block for the purpose of obtaining small blocks in which corresponding components are contained.

DESCRIPTION OF THE PREFERRED EMBODIMENT

Figure 4:
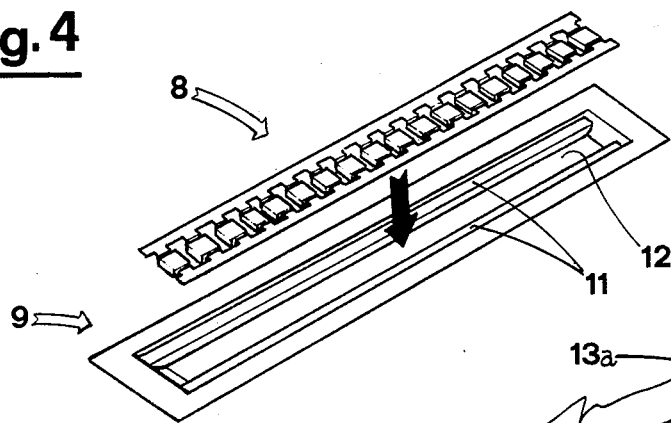
FIG. 4 shows the insertion into the mould of the unit constituted by the components and the strips.

The first phase in the process (FIG. 1) envisages the creation of two conductor strips (1), each of which provided, along one longitudinal edge, with end pieces (2) whose external parts (2a) (having therein corresponding through holes) are bent on one and the same side and, in particular, at a right angle with respect to the plane defined by the corresponding strip. In the example in FIG. 1, the strips are identical, while the end pieces are equidistant one with respect to the other. Also shown in FIG. 1 is the element (4) out of which, first of all, the end pieces are fashioned and then the part (2a) thereof is bent downwards.

Following the formation of the strips, the orientation of these is envisaged in the first phase, in such a way that each end piece of a strip be opposite a corresponding end piece of the other strip.

In the second phase of the process, the electrical connection, through welding, is envisaged of the free ends (6a) of electric-electronic components (6) (in the example given in FIG. 2, capacitive components) to the bent parts (2a) of two opposite corresponding end pieces (2), thereby making possible the construction of a unit constituted by the two strips (1) and by the plurality of components (8) locked to the said strips.

The foregoing is illustrated diagrammatically in FIG. 2, in which at (7) are shown known means for effecting the union of the free ends (6a) to the parts (2a) by means of electrical spot welding.

Shown diagrammatically in FIG. 3 is a mould (9) produced through the permanent cold deformation of a sheet (9a), interposing the said sheet between a punch (10a) and a die (10b). The insertion of the punch into the die causes a mould to be created.

The material used for the sheet (9a) (for example a sheet of aluminum lined with a layer of polyethylene) must have the features described below.

The conformation of the mould is such as to be provided with two longitudinal seats (11) able to receive resting thereon, the strips (1) of a corresponding unit (8), in between which provision is made for a longitudinal impression (12) wherein the components (6) of the said unit are freely accepted (see FIG. 4).

The forming of the mould constitutes a further phase in the process in question, and more precisely the third phase thereof, though this phase does not necessarily have to follow on, in the order stated, after the two previously mentioned phases.

Figure 5:
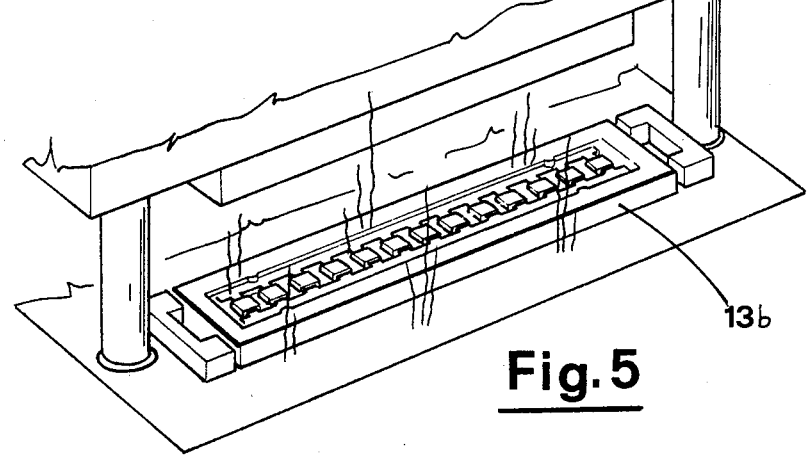
FIG. 5 shows the heat sealing of the unit strips to the mould.

After the unit has been inserted into the mould (9), the strips (1) have to be secured to the seats (11); this can be achieved in various ways, for example through the heat sealing method using the known means (13a) and (13b) shown diagrammatically in FIG. 5. It must be stressed that the polyethylene layer notably contributes to the said operation.

The stable insertion of the unit (8) into the mould (9) (see FIGS. 4 and 5) defines the fourth phase of the process.

Figure 6:
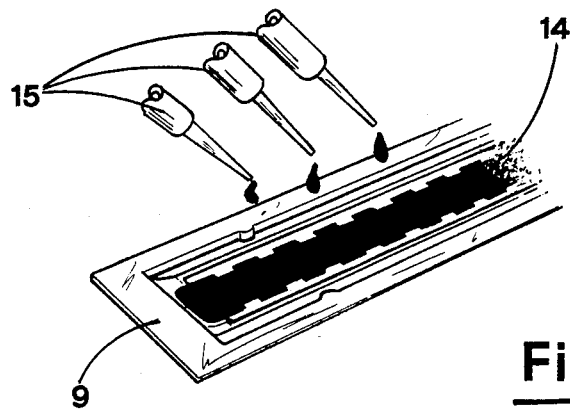
FIG. 6 shows the pouring into the mould of the liquid sealant.

In the fifth, using known means (15), the pouring is envisaged of the liquid sealant (14) (for example thermosetting or thermoplastic resin etcetera) into the impression (12) in the mould (9) until the components (6) have been covered completely but without the sealant reaching the strips (1); indeed in the case under examination (see FIG. 6), it is sufficient for the level of the sealant to be slightly be-low the plane defined by the seats (11) in the mould (9).

The situation to which reference has just been made is maintained until the sealant (14) has fully set. Once this is so, the one piece block (16) formed by the sealant in which the components (6) are dipped and from which the end pieces (2) partially project and from which the strips (1) fully project, is separated from the mould (9) (see FIG. 7), this operation defining the sixth phase of the process.

In cases when the sealant (14) is constituted by liquid resin, it is necessary that the material used in the making of the mould (9) be able to withstand, without becoming misshapen, the temperature of the said liquid resin (14) and, furthermore, that it allows the quick and simple separation of the one piece block (16) from the mould (9) which is of the type used once only and then discarded.

It is envisaged in the seventh phase of the process that the definition should take place of the electrical terminations (17) of the components (6) embedded in the one piece block (16), with the formation there from of small blocks (21), each of which constituted by solidified sealant in which the corresponding circuit component (6) is embedded, and from which project the electrical terminations (17) of the said individual components.

Two possibilities are envisaged, as shown in the accompanying figures, for the definition of the said electrical terminations.

With the first method (see FIG. 8), the areas (1a) of a strip (1) in between the end pieces (2) are cut (using known means (18)).

With the second non-illustrated method, the longitudinal cutting is effected of the end pieces at points corresponding to the areas where they are joined to corresponding strips.

The foregoing obviously requires the end pieces (2) to be of a length such as to enable the cutting operation to be performed without any risk of damage to the one piece block (16).

The said electrical terminations (17) are defined by the internal parts of the end pieces (2).

The parts (17a) of the said end pieces (2) that project from the upper plane of the one piece block (16) are bent closely up against the longitudinal sides of the one piece block; this is done using known means (19) (see FIG. 9).

The one piece block (16) got ready in this way enables the components embedded therein to be tested in a fast and efficient manner.

By cutting the one piece block (16) crosswise (using known means (20)) in the region of the centre line planes existing between the pairs of electrical terminations (17) (FIG. 10), small blocks (21) are created, each of which constituted by one component (6) inside a protective envelope of solidified sealant, from which project the terminations (17) thereof (see FIG. 10).

In place of the strips (1) and the end pieces (2), the use is possible of flat conductor elements (such as twin-lead or blade elements etcetera) or of filiform elements (such as terminals). In this case corresponding conductor elements have to be welded to the free ends (6a) of the components (6).

The unit (8) is defined, in the variant to which reference has just been made, by a plurality of components (6) provided with the said conductor elements, placed side-by-side in an orderly fashion, one spaced away from the other.

The internal extremities of the said elements are rested on the seats (11) of the mould, and to these are bonded in a known fashion, for example through the previously mentioned heat-sealing method.

The remaining phases of the process are similar to those already outlined with reference to the accompanying figures. It is stressed that in this case the electrical terminations (17) are defined by the internal extremities of the conductor elements.

A further possible variant would be to provide a frame whose longitudinal sides are constituted by the strips (1), with the said strips connected by at least two transverse strengthening elements.

The electrical terminations (17) can be bent in any way with respect to the one piece block (16), for example closely up against the longitudinal sides of the block (as in FIG. 9), or upwards etcetera. The said terminations can also be utilized as oriented at the time of the definition thereof: in this case there is no need for them to be bent.

Injection moulds are not used for the process according to the invention. Thus the problems mentioned in the introductory part of this text consequential to the use of such items of equipment are eliminated.

Used instead of an injection mould is a common or garden mould (of a low cost and easy to make) into which is poured, following the insertion therein of a unit (8), sealant, particularly in the form of liquid resin. To experts in the field concerned, the advantages of this procedure are obvious.

Very narrow tolerances in the dimensions of the mould (9) and of the unit (8) are not required. It is, in fact, sufficient for the components (6) to be spaced suitably one way from the other (when secured to the strips) and, furthermore, for the mould to be provided with the seats (11) and the impressions (12) in such a way as to permit the strips to rest on the former and the components to rest on the latter.

It is stressed that one mould (9) can be utilized for units that are not all alike, that is to say, for units whose components differ (from unit to unit) in the longitudinal dimensions thereof, provided that the said dimensions can be freely accepted in the impression (12).

The process in question is extremely flexible both for the reasons to which reference has been made, and essentially because of the fact that the creation of a mould dimensioned differently to the one previously used, and also of a unit (8) corresponding to the new type mould, can be effected in short spaces of time and at a cost that is limited in comparison with the times and costs involved with the present known art for which injection moulds are utilized.

Indeed all that has to be done is to operate the punch (10a) and the die (10b) (see FIG. 3) and to vary the position one with respect to the other of the end pieces (2) (and possibly the dimensions of these).

As is known, various types of sealant are marketed. The sealant (14) used in this process has to be selected to suit the type of electric-electronic component to be protected, to suit the use to which the said component is to be put and, lastly, to suit the environment in which the said component is going to operate, through principally the protective envelope has to safeguard efficiently the component at the time of the welding of the electrical terminations (17) to the conductor tracks of the printed circuit, thereby fulfilling the technical task of the invention.

In the description given herein, the mould (9) into which the sealant is poured takes the form shown in FIG. 3, though it is obvious that any other type of mould can be employed (also constituted by two or more elements assembled together and interlocked) such as to have seats on which the strips or internal extremities of the said flat and/or filiform conductor elements can rest, an impression that accepts the components of the unit (8) and, lastly, such as to allow the dipping with sealant solely of the components without the internal parts of the end pieces being affected.

The shape of the end pieces (2) (in particular the external parts (2a)), or as regards the stated variant, the shape of the conductor elements (in particular the external extremities), must be such as to facilitate the welding thereof to the free ends (6a) of the components (6). This is of the utmost importance for the purpose of achieving between the end pieces (or the conductor elements) and the component optimum mechanical anchoring and electrical connection.

Stress is laid on the fact that, following the pouring of the sealant, there is no trace of this on the end pieces (2) of the block (16). This constitutes a notable advantage with respect to the known art (injection moulding) where, as stated in the introductory part of this text, it was necessary to clean the end pieces of the frame.

With the process according to the invention it is possible to produce protective envelopes for any type of electric or electronic component (such as capacitors, resistors, inductors, diodes, complex active circuits of, for example, the integrated type etcetera) having two or more electrical terminations and, consequently, to create blocks (21) with or without clinched terminations (FIG. 9). Blocks (21) with clinched terminations serve efficiently for what is called "surface mounting", namely installation on one side of the printed circuit to the conductor tracks of which the welding of the terminations (17) is effected directly.

Blocks (21) without clinched terminations, having instead terminations (17) in the form of terminals, serve efficiently for mounting on conventional printed circuits (that is to say the ones provided with a through hole for each component), this form of installation being accomplished by inserting the terminals through the through holes and then effecting a soldering operation.

The protection afforded to the technical solution according to the invention is understood to cover the individual phases of the process and the combination of these that define the process in question, and thus all technical solutions and/or variants with which the creativeness emerging from the phases of the said process is realized, are understood to fall within the framework of protection given to the invention as claimed hereinafter.

What is claimed is:

1. A process for producing protective envelopes in which portions of corresponding electric-electronic circuit components are encased, comprising the steps of:
   (a) forming a plurality of conductor strips, each strip having conductor projections extending from one side of said strip;
   (b) welding corresponding projections of two aligned conductor strips to intermediate corresponding conductor elements, thereby forming a circuit components unit composed of a plurality of aligned circuit components;
   (c) creating an elongated mold having at least one longitudinal impression with a bottom surface, said impression suitable to receive said circuit components unit;
   (d) stably inserting said unit into the mold with the circuit components positioned in said impression and spaced from said bottom surface;
   (e) pouring a liquid sealant into said impression and over said circuit components, thereby encapsulating only the components of said unit and forming a one piece block, and setting said sealant;
   (f) separating said mold from said one piece block, with said conductor projections at least partially projecting from said one piece block; and
   (g) cutting said block into a plurality of small blocks made of solidified sealant, inside each of which is contained one corresponding circuit component from which electrical terminations protrude.

2. The process of claim 1 including the step of removing the strips from said block except for the projections.

3. The process of claim 2 including the step of bending the projections in a predetermined orientation against said block subsequent to the step of removing said strips.

4. The process of claim 1 wherein said mold includes longitudinal seats on each longitudinal side of said impression for seating said conductor strips.

5. The process of claim 4 wherein said step of stably inserting includes the step of securing said conductor strips to said seats prior to pouring the liquid sealant.

6. The process according to claim 4 wherein said step of creating a mold comprises making the mold from polyethylene coated aluminum sheet.

7. The process according to claim 6, said step of stably inserting includes stably supporting the unit in the mold by heat-sealing the conductor strips to the polyethylene coating.

8. The process of claim 1 wherein said projections on said strips have bent ends.

9. The process of claim 1 wherein said projections on said strips have bent ends and wherein said step of welding comprises welding the bent ends to ends of said conductor elements.

10. The process of claim 1 including the step of cutting from said strips portions thereof intermediate adjacent projections.

11. The process of claim 1 wherein said projections on said strips have through holes therein at ends thereof.

12. A process for producing encapsulated electrical components, comprising the steps of:
   (a) forming two corresponding conductor strips, each having a plurality of uniformly spaced conductor projections;
   (b) arranging said strips in opposed relationship so that each projection of one strip is uniformly spaced from and opposite a corresponding projection of the other strip;
   (c) joining a series of electrical components to the spaced conductor projections of the opposed conductor strips, thereby forming a strip unit comprising spaced apart electrical components joined to and supported between opposite projections of the opposed strips;
   (d) creating a mold having at least one longitudinal impression with a bottom surface, said impression suitable to receive said strip unit;
   (e) stably inserting said strip unit into the mold, and supporting the strip unit within the mold by resting the conductor strips on a portion of the mold, each electrical component depending from said strips and being spaced from the bottom surface of said impression;
   (f) pouring a liquid sealant into said impression, thereby encapsulating each electrical component while leaving parts at least of each conductor projection exposed, and setting said sealant, thereby providing a unitary block;
   (g) removing the unitary block from the mold; and
   (h) separating the block transversely into a plurality of encapsulated components, each comprising a totally enclosed electrical component with electrical connections protruding from the encapsulating material.

13. The process according to claim 12 wherein said step of creating a mold comprises making the mold from polyethylene coated metal sheet.

14. The process according to claim 13 wherein the metal is aluminum.

15. The process according to claim 13 wherein the step of stably inserting and supporting the strip unit in the mold includes the step of heat-sealing the conductor strips to the polyethylene coating.

16. The process according to claim 12 and including, prior to said step of separating the unitary block, the step of trimming a portion of each conductor strip from the unitary block, thereby leaving each electrical component with two opposed conductor projections protruding from the block.

17. The process according to claim 16 and including, prior to said step of separating the unitary block, the step of bending the conductor projections of each electrical component into close contact with longitudinal faces of the unitary block.

18. The process according to claim 12 wherein said step of creating a mold includes forming a longitudinal seat on each longitudinal side of said impression for seating said conductor strips.

19. A process for producing encapsulated electrical components, comprising the steps of:
   (a) forming a unit comprising spaced apart electrical components joined to a framework having longitudinal sides, and including conductor elements connected to said electrical components;
   (b) providing a tank, a longitudinal cavity at the bottom of said tank, and a raised seat on each longitudinal side of said cavity, said tank and said framework having a configuration whereby upon insertion of said unit into said tank said electrical components will be gathered into said cavity with said longitudinal sides of said framework supported on said seats;
   (c) inserting said unit into said tank thereby gathering said electrical components into said cavity and supporting said longitudinal sides at said framework on said seats,
   (d) pouring a liquid encapsulating material into said cavity and setting said encapsulating material, thereby forming a block of encapsulated components with part at least of each of said conductor elements exposed; and
   (e) removing said block from the tank and separating the block into a plurality of smaller blocks, each smaller block comprising an encapsulated electrical component with protruding conducting elements.

20. The process of claim 19 and further comprising the step of locking said longitudinal sides to said seats prior to pouring said encapsulating material.

21. The process of claim 20 wherein said step of locking comprises heat-sealing said longitudinal sides to said seats.

22. The process of claim 21 wherein said step of providing a tank comprises providing a tank having seats made of polyethylene coated metal.

23. The process of claim 22 wherein said metal is aluminum.

24. The process of claim 19 wherein said step of providing a tank comprises providing a tank having said seats located bilaterally with respect to said cavity and extending along the length of said cavity.

25. The process of claim 19 and further including the step of bending said conducting elements with respect to said encapsulating material after said material has set.

26. The process of claim 19 and further including the step of cutting at least a portion of said frame from said block before separating the block into smaller blocks.

27. The process of claim 19 wherein said step of forming a unit comprises: providing a plurality of strips, each strip having a plurality of uniformly-spaced conductor elements;
   arranging said strips in opposed relationship with each conductor element of one strip uniformly spaced from and opposite to a corresponding conductor element of another strip; and
   joining said electrical components to said conductor elements.

28. The process of claim 27 wherein said conductor elements comprise projections from said strip.

29. The process of claim 28 wherein said strips and said projections are flat and said projections project out of a plane of said strip.

* * * * *